United States Patent
Zhang et al.

(10) Patent No.: US 11,449,657 B2
(45) Date of Patent: Sep. 20, 2022

(54) INTEGRATED INPUT/OUTPUT PAD AND ANALOG MULTIPLEXER ARCHITECTURE

(71) Applicant: NXP USA, Inc., Austin, TX (US)

(72) Inventors: Wenzhong Zhang, Tianjin (CN); Ajay Kumar Sharma, Dwarka (IN); Rishi Bhooshan, Greater Noida (IN)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 17/124,283

(22) Filed: Dec. 16, 2020

(65) Prior Publication Data

US 2022/0188499 A1    Jun. 16, 2022

(51) Int. Cl.
| | | |
|---|---|---|
| *G06F 30/394* | (2020.01) | |
| *H03K 17/693* | (2006.01) | |
| *H01L 23/495* | (2006.01) | |
| *G06F 30/392* | (2020.01) | |
| *G06F 30/34*  | (2020.01) | |

(52) U.S. Cl.
CPC .......... *G06F 30/394* (2020.01); *G06F 30/34* (2020.01); *G06F 30/392* (2020.01); *H01L 23/4951* (2013.01); *H03K 17/693* (2013.01)

(58) Field of Classification Search
USPC ....................................................... 716/126
See application file for complete search history.

(56) References Cited

U.S. PATENT DOCUMENTS

| | | | | |
|---|---|---|---|---|
| 8,196,087 B2 * | 6/2012 | Wasily | ............... | H01L 27/0203 716/135 |
| 8,549,447 B2 * | 10/2013 | Eisenstadt | ........... | H01L 23/5225 716/120 |
| 2006/0273809 A1 * | 12/2006 | Miller | ............. | G01R 31/31905 324/750.05 |
| 2016/0079994 A1 * | 3/2016 | Lee | ..................... | H03M 1/1245 341/118 |

FOREIGN PATENT DOCUMENTS

EP           3503180 A1     6/2019

* cited by examiner

*Primary Examiner* — Mohammed Alam

(57) ABSTRACT

Area and routing overhead issues of traditional anamux incorporation in a semiconductor device are overcome by placing a functional anamux block on top of an I/O pad. In some embodiments, multiple anamux blocks can be stacked either vertically or placed on neighboring I/O pads for horizontal stacking. Embodiments provide the anamux blocks as the same width as the I/O pads and the width is optimized to minimize padring height. In some embodiments, a power/ground I/O (PGE) bond pad architecture is enabled by the incorporation of both I/O pad and anamux blocks in the same region, providing two bonding regions, which can further reduce chip area. Some embodiments also permit routing of signals through the anamux block to neighboring blocks and the I/O channels.

19 Claims, 4 Drawing Sheets

INTEGRATED INPUT/OUTPUT PAD AND ANALOG MULTIPLEXER ARCHITECTURE

BACKGROUND

Field

This disclosure relates generally to semiconductor devices, and more specifically, to reducing area and routing overhead by placing analog multiplexer cells in the input/output pad ring of a semiconductor device die.

Related Art

In many of today's semiconductor device applications, multiple analog-to-digital converters and analog comparators are integrated throughout the chip. The input/output (I/O) channels for these IP blocks are multiplexed on I/O pads through hard macro analog multiplexers ("anamuxes"). Typically, the anamux blocks are placed in an area of the chip that is space limited and can consume significant die area and routing overhead. In some device designs, anamuxes are placed in the I/O padring adjacent to I/O pads, and in other designs the anamuxes are placed in I/O channels near the padring. Again, this placement takes up space that can be used by I/O pads or increases the area needed by the I/O channels.

It is therefore desirable to overcome the area and routing overhead issues of traditional approaches.

BRIEF DESCRIPTION OF THE DRAWINGS

Embodiments of the present invention may be better understood by referencing the accompanying drawings.

The use of the same reference symbols in different drawings indicates identical items unless otherwise noted. The figures are not necessarily drawn to scale.

DETAILED DESCRIPTION

Embodiments of the present invention overcome area and routing overhead issues of traditional anamux incorporation in a semiconductor device by placing a functional anamux block on top of an I/O pad. In some embodiments, multiple anamux blocks can be stacked either vertically or placed on neighboring I/O pads for horizontal stacking. Embodiments provide the anamux blocks as the same width as the I/O pads and the width is optimized to minimize padring height. In some embodiments, a power/ground I/O (PGE) bond pad architecture is enabled by the incorporation of both I/O pad and anamux blocks in the same region, providing two bonding regions, which can further reduce chip area. Some embodiments also permit routing of signals through the anamux block to neighboring blocks and the I/O channels.

Figure 1:
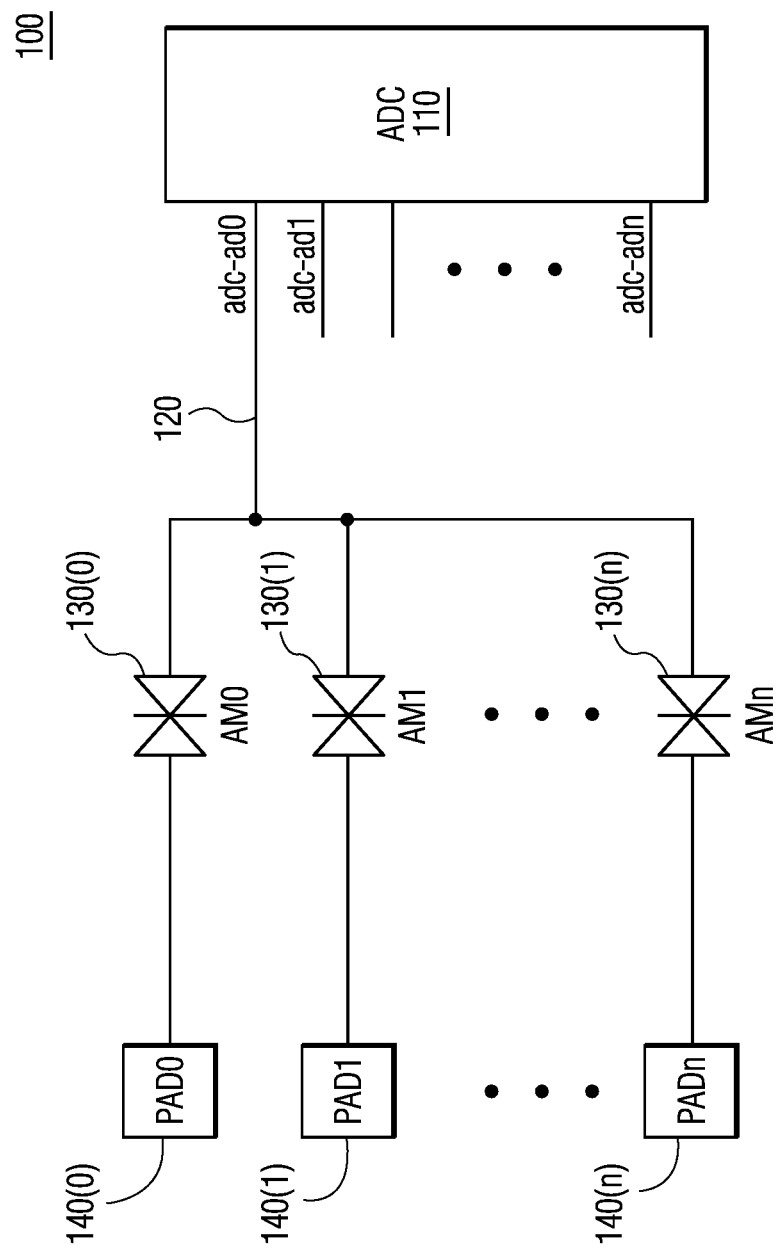
FIG. 1 is a simplified block diagram of an example system including anamuxes used to provide input/output (I/O) channels for various channels of an analog-to-digital converter (ADC).

FIG. 1 is a simplified block diagram of an example system 100 including anamuxes used to provide input/output (I/O) channels for various channels of an analog-to-digital converter (ADC). ADC 110 has a set of ADC channels adc_ad0 through adc_adn. ADC channel 120 (adc_ad0) is connected to multiple I/O pads 140(0)-140(n) via anamuxes (AM) 130(0)-130(n). Similarly, the other ADC channels would also be coupled to the I/O pads via the various anamuxes. As illustrated, there are multiple anamux blocks needed to serve each ADC in a semiconductor device.

Traditionally, anamuxes used to handle I/O channels for ADCs and analog comparators (ACMPs) have been placed in regions of the sea of gates or I/O channels, but this can account for significant die area and routing overhead.

Figure 2:
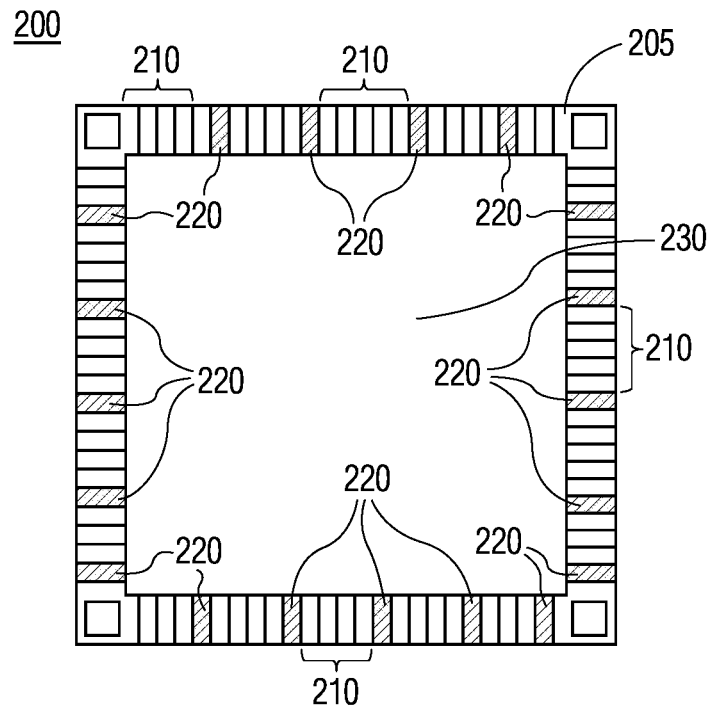
FIG. 2 is a simplified block diagram illustrating one example of anamux placement in a traditional semiconductor device.

FIG. 2 is a simplified block diagram illustrating one example of anamux placement in a traditional semiconductor device die 200. In this example, the anamuxes 220 are placed in padring 205 among I/O pads 210. Use of such a design can be when space in the semiconductor device core 230 is limited. But the placement of the anamuxes consumes a spot for an I/O pad in the padring.

Figure 3:
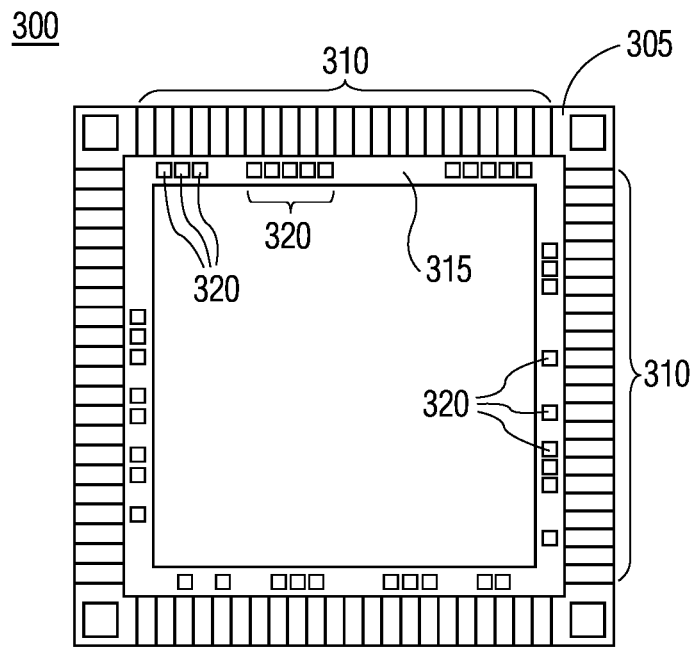
FIG. 3 is a simplified block diagram illustrating another example of anamux placement in a traditional semiconductor device.

FIG. 3 is a simplified block diagram illustrating another example of anamux placement in a traditional semiconductor device die 300. In this example, anamuxes 320 are placed in I/O channels region 315 near padring 305 that contains I/O pads 310. By incorporating the anamuxes in the I/O channel region, there is a significant increase in I/O channel region area due to increased width of the I/O channel region. In one example, inclusion of anamuxes in the I/O channel region can increase the I/O channel region width to 115 microns. As will be discussed in greater detail below, embodiments of the present invention can reduce the I/O channel region width to less than half that.

Further, integration of anamuxes in the I/O channels area can lead to significant routing implementation challenges (e.g., from the I/O pad to the anamux and from the anamux to the ADC/ACMP) due to needs for low resistance and low noise coupling. Such routing and shielding requirements, such as coaxial shielding and star routing, can increase chip area by as much as 2-3%. As will be discussed in greater detail below, embodiments of the present invention avoid the routing challenges between the I/O pad and the anamux, as well as shielding challenges.

As a solution to the issues presented above, embodiments provide an architecture for anamux and I/O integration for ADC and ACMP I/O channels by placing the functional anamux block on top of an I/O pad. These functional blocks can, in turn, be stacked horizontally or vertically and provide signal routing through the functional blocks for communication with neighboring blocks.

Figure 4:
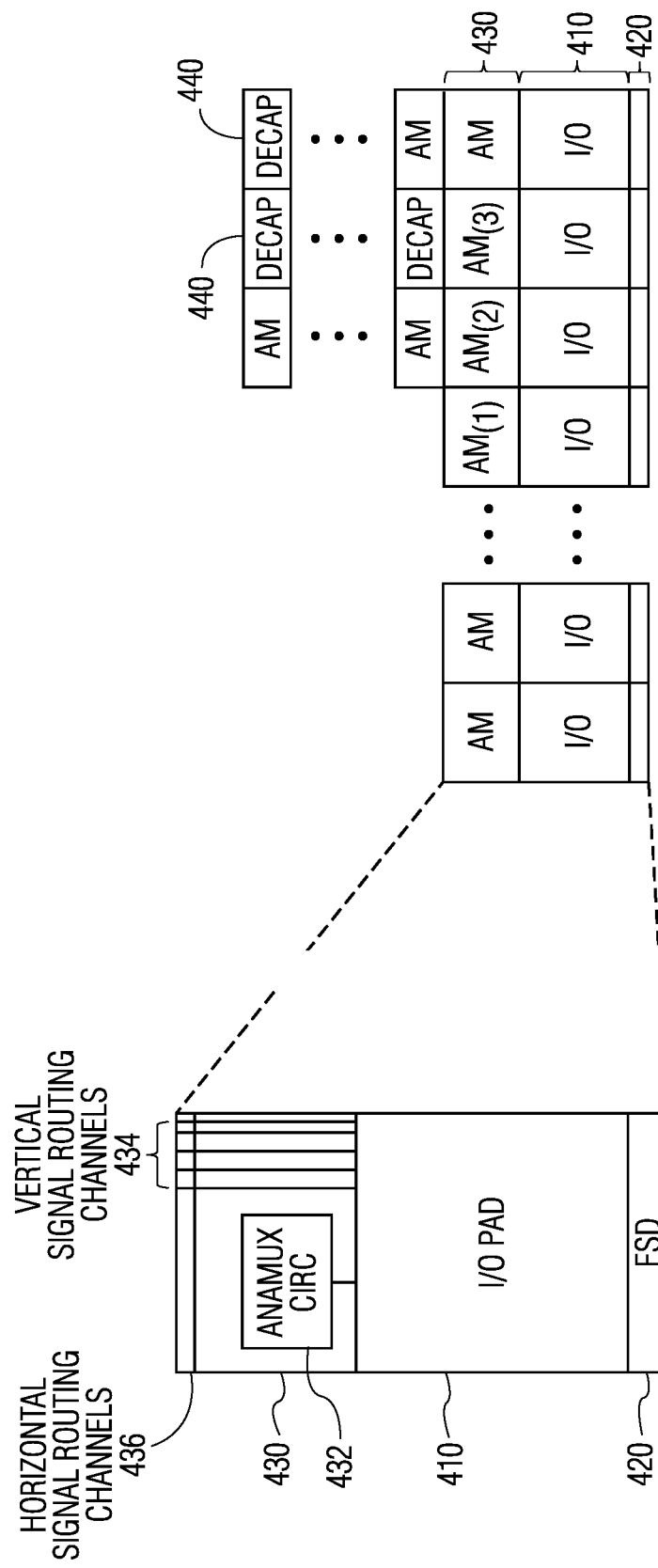
FIGS. 4A and 4B are simplified block diagrams illustrating a cross section of an example of the anamux and I/O architecture, in accordance with embodiments of the present invention.

FIGS. 4A and 4B are simplified block diagrams illustrating a cross section of an example of the anamux and I/O architecture on a semiconductor device die, in accordance with embodiments of the present invention. FIG. 4A illustrates an example of a stack of an I/O pad 410 on an electrostatic-discharge (ESD) prevention layer 420. Formed on top of the I/O pad is an anamux block 430 that includes anamux circuitry 432.

To reduce routing overhead associated with the anamux blocks, routing channels are provided in anamux block 430. For example, anamux block 430 includes a set of vertical signal routing channels 432, which can pass signals from I/O pad 410 to a block located vertically on top of anamux block

430. An example of such a vertically-stacked block is illustrated in FIG. 4B, in which some anamux blocks 430 have either another anamux (AM) stacked on the lower anamux block, or a decoupling capacitor (DECAP) stacked on the lower anamux block. Further, anamux block 430 includes one or more horizontal signal routing channels 436 that enable passing of signals from a block neighboring the anamux block to another neighboring block. As illustrated in FIG. 4B, signals can be passed from an anamux block 430, AM(1), through a neighboring AM block, AM(2), to a next AM block, AM(3). By providing routing between abutting anamux blocks, routing overhead in the core and the I/O ring is reduced. For example, with the abutment between the anamux blocks and the I/O pads, the routing channel between anamux and I/O pads of the traditional architectures can be eliminated, thus saving about 20 microns of width in the I/O routing channels region or an overall routing overhead reduction of 2%. Further, the ability to incorporate DECAP blocks in the I/O padring increases flexibility while also saving core area in which traditional decoupling capacitors are incorporated. In certain embodiments, a DECAP block will be the same height as an AM block.

An added benefit of having the additional height introduce by incorporating the AM and DECAP blocks in the I/O padring, is that power/ground bonding (PGE) can be incorporated because the additional height permits two bonding windows in the region of an I/O pad. Thus, a power/ground bond and an I/O bond can be provided in the I/O pad bonding region, eliminating the need for certain power pads in the padring, as will be illustrated below with regard to FIG. 5. Without an AM or DECAP on top of an I/O pad, PGE bonding cannot be performed since the height of the I/O pad alone does not support two bonding windows to be placed vertically.

Figure 5:
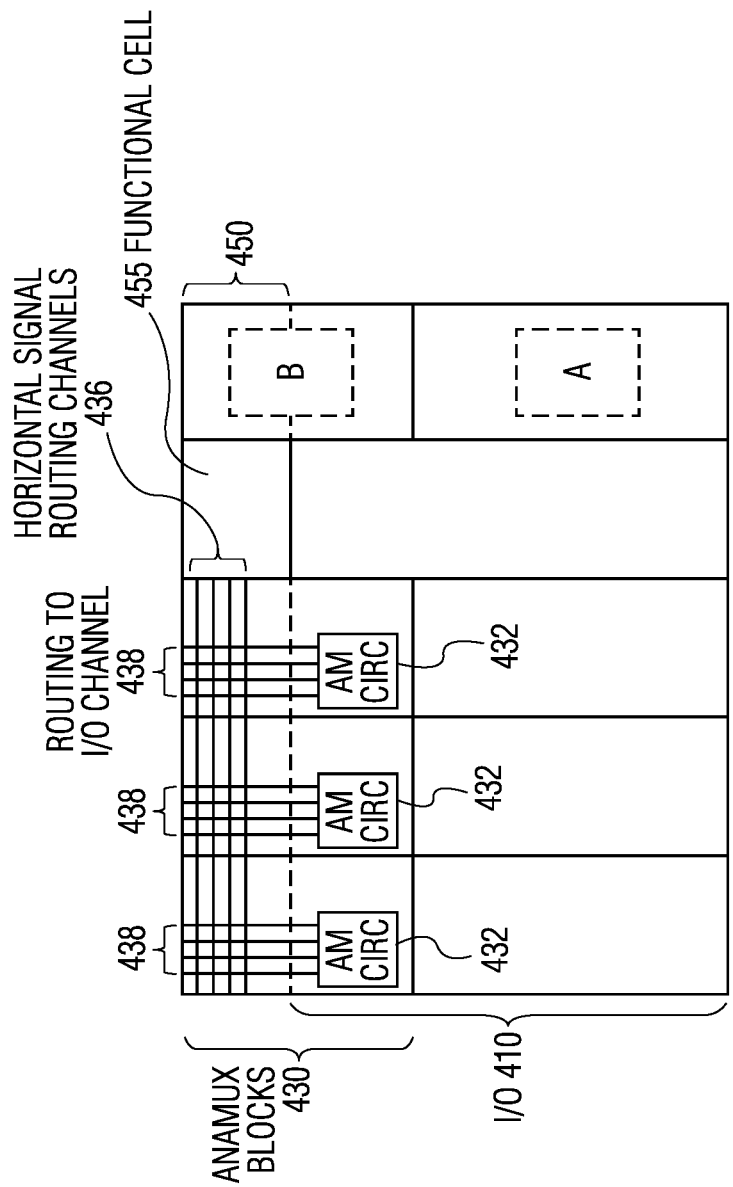
FIG. 5 is a simplified block diagram illustrating a plan view of the anamux and I/O pad architecture, in accordance with embodiments of the present invention.

FIG. 5 is a simplified block diagram illustrating a plan view of the anamux and I/O pad architecture on a semiconductor device die, in accordance with embodiments of the present invention. FIG. 5 illustrates a set of I/O pads 410, three of which have anamux blocks 430 formed over a portion of the top surface of each I/O pad. As illustrated, each anamux block 430 is of the same width as the corresponding I/O pad 410. The width of the I/O pads and anamux blocks is selected to optimize the height of the padring region, since, as the width of the anamux block is reduced, the height is increased to accommodate the circuitry therein. The anamux blocks communicate with the I/O channels (e.g., in I/O channel region 315) through signal routing channels 438.

In the example illustration of FIG. 5, the anamux blocks 430 are formed such that a portion of the anamux block extends over the edge of the I/O pads nearest the I/O channel of the semiconductor device. By so doing, a region 450 of about 25 microns in width is created in which additional functional cells 455 can be provided. Signal routing is provided to functional cells 455 by horizontal signal routing channels 436 in anamux blocks 430. Thus, the horizontal signal routing channels not only can provide signals between neighboring anamux blocks, but also to the additional functional cells. In this manner, for core space limited designs, some functionality can be moved to the I/O padring region with signal routing provided by the anamux blocks.

As discussed above, in an example of a traditional embodiment where anamux blocks are incorporated in the I/O channel, the width of the I/O channel is about 115 microns with an I/O padring width of about 183 microns. By comparison, for an example embodiment of the present disclosure, the I/O channel width is about 40 microns with an I/O padring width of 207 microns. This example results in a width saving of 51 microns and an area saving of about 17% in the padring region. This area reduction in the padring region can result in an overall area reduction in die size of about 4%, which can improve gross margin.

As previously discussed, the additional height introduced by incorporating the AM and DECAP blocks in the I/O padring, is that power/ground bonding can be incorporated because the additional height permits two bonding windows in the region of an I/O pad. FIG. 5 illustrates an example of two bonding locations provided by the stacked AM and I/O pad blocks in region A of an I/O pad 410 and region B of an AM block 430.

Embodiments provide a mechanism by which anamux functional blocks can be incorporated in the I/O padring of a semiconductor device. The anamux functional blocks are formed on top of I/O pads and can provide routing from the I/O pad not only to the anamux circuitry in the anamux block, but also to neighboring anamux blocks via internal signal routing channels as well as the sea of gates in the SoC core. The inclusion of these anamux blocks in the padring can reduce area consumption in the core of the semiconductor device and overall area consumption of the device.

By now it should be appreciated that there has been provided a semiconductor device that includes a core region including circuits formed on a substrate, and an input/output pad region formed on the perimeter of the semiconductor device around the core region. The input/output region includes a plurality of input/output (I/O) pads formed over the substrate, one or more analog multiplexer (anamux) blocks, each anamux block formed on a top surface of a corresponding I/O pad, and each anamux block including analog multiplexer circuitry coupled to the corresponding I/O pad.

In one aspect of the above embodiment the analog multiplexer circuitry of each anamux block is further coupled to one of one or more analog-to-digital converters or one or more analog comparators.

In another aspect of the above embodiment, each anamux block includes one or more signal routing channels each configured to pass a signal from a first major surface of the anamux block to one of an opposing second major surface of the anamux block and the core region. In a further aspect, the first major surface abuts the I/O pad corresponding to the anamux block in a still further embodiment, the functional block formed on the top major surface of the anamux block is one of a second anamux block and a decoupling capacitor. In yet a further aspect, a second functional block is formed on a top major surface of the second anamux block, and the second functional block is one of a third anamux block and a decoupling capacitor.

In another aspect, the first major surface abuts a first neighboring functional block, the second major surface abuts a second neighboring functional blocks, and each of the first and second neighboring functional blocks are formed on corresponding I/O pads neighboring the I/O pad corresponding to the anamux block. In yet a further aspect, one of the first and second neighboring functional blocks is one of a second anamux block and a decoupling capacitor.

In yet another aspect, a height of an anamux block and the corresponding I/O pad permits to vertically-placed bonding windows in the I/O pad region. In still another aspect, a width of the anamux block is the same as a width of the I/O pad corresponding to the anamux block.

In another embodiment, a method is provided for forming a semiconductor device. The method includes providing a semiconductor substrate where the semiconductor device is formed on a device region of the semiconductor substrate, forming one or more circuits in a core region of the device region, forming a plurality of I/O pads on the perimeter of the device region around the core region, and forming one or more analog multiplexer (anamux) blocks, where each anamux block is formed to include analog multiplexer circuitry coupled to the corresponding I/O pad.

One aspect of the above embodiment further includes forming one or more analog-to-digital converters or one or more analog comparators in the core region, and electrically coupling the one or more analog-to-digital converters or one or more analog comparators to one or more of the analog multiplexer circuitry.

Another aspect of the above embodiment includes forming one or more signal routing channels in each anamux block. A first set of the one or more signal routing channels is formed from a first major surface of the anamux block to an opposing second major surface of the anamux block. Each signal routing channel of the first set is configured to pass a signal from the first major surface to the opposing second major surface. A second set of the one or more signal routing channels is formed from the first major surface of the anamux block and configured to pass a signal from the first major surface to the core region. A further aspect includes forming the first major surface of the anamux block on a top major surface of the I/oh pad corresponding to the anamux block, forming the second major surface of the anamux block is a top major surface of the anamux block, and forming a functional block on the second major surface of the anamux block where one or more of the signal routing channels electrically couples the I/O pad to circuitry comprised in the functional block. In yet a further aspect, the functional block formed on the top major surface of the anamux block is one of a second anamux block and a decoupling capacitor.

In yet a further aspect, the method includes forming the first major surface of the anamux block to abut a first neighboring functional block, forming the second major surface of the anamux block to abut a second neighboring functional block, and forming each of the first and second neighboring functional blocks on a corresponding I/O pads neighboring the I/O pad corresponding to the anamux block. In a further aspect, one of the first and second neighboring functional blocks is one of a second anamux block and a decoupling capacitor.

In still a further aspect, the method includes forming the anamux block and the corresponding I/O pad of a height that permits to vertically-placed bonding windows in the I/O pad region. In another further aspect, the method includes forming the anamux block such that a width of the anamux block and a width of the corresponding I/O pad are the same.

Another embodiment provides an I/O pad region of a semiconductor device that includes an I/O pad formed over a substrate, and an anamux block formed over the I/O pad where the anamux block includes analog multiplexer circuitry electrically coupled to the I/O pad.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A semiconductor device comprising:
   a core region comprising circuits formed on a semiconductor device die; and
   an input/output (I/O) pad region formed on a perimeter of the semiconductor device die around the core region, wherein the I/O pad region comprises:
      a plurality of I/O pads formed over a substrate of the semiconductor device die; and
      one or more analog multiplexer (anamux) blocks, wherein each anamux block is formed on a top surface of a corresponding I/O pad, and each anamux block comprises analog multiplexer circuitry coupled to the corresponding I/O pad.

2. The semiconductor device of claim 1 wherein the analog multiplexer circuitry of each anamux block is further coupled to an analog to digital converter of one or more analog to digital converters or an analog comparator of one or more analog comparators.

3. The semiconductor device of claim 1 wherein each anamux block comprises one or more signal routing channels, and wherein each signal routing channel is configured to pass a signal from a first major surface of the anamux block to an opposing second major surface of the anamux block or the core region.

4. The semiconductor device of claim 3, wherein:
the first major surface of the anamux block abuts the corresponding I/O pad; and
the second major surface of the anamux block abuts a functional block formed on a top major surface of the anamux block.

5. The semiconductor device of claim 4, wherein the functional block formed on the top major surface of the anamux block is one of a second anamux block and a decoupling capacitor.

6. The semiconductor device of claim 5, wherein:
a second functional block is formed on a top major surface of the second anamux block; and
the second functional block is one of a third anamux block and a decoupling capacitor.

7. The semiconductor device of claim 3, wherein:
the first major surface of the anamux block abuts a first neighboring functional block;
the second major surface of the anamux block abuts a second neighboring functional block; and
each of the first and second neighboring functional blocks are formed on I/O pads neighboring the corresponding I/O pad.

8. The semiconductor device of claim 7, wherein at least one of the first and second neighboring functional blocks is a second anamux block or a decoupling capacitor.

9. The semiconductor device of claim 3, wherein a height of an anamux block and the corresponding I/O pad permits two vertically-placed bonding windows in the I/O pad region.

10. The semiconductor device of claim 3, wherein a width of an anamux block is the same as a width of the corresponding I/O pad.

11. A method for forming a semiconductor device die, comprising:
providing a semiconductor substrate, wherein the semiconductor device die is formed on a device region of the semiconductor substrate;
forming one or more circuits in a core region of the device region;
forming a plurality of input/output (I/O) pads on a perimeter of the semiconductor device die around the core region; and
forming one or more analog multiplexer (anamux) blocks, wherein each anamux block is formed on a top surface of a corresponding I/O pad, and wherein each anamux block comprises analog multiplexer circuitry coupled to the corresponding I/O pad.

12. The method of claim 11 further comprising:
forming one or more analog-to-digital converters or one or more analog comparators in the core region; and
electrically coupling the one or more analog-to-digital converters or one or more analog comparators to one or more of the analog multiplexer circuitry.

13. The method of claim 11 further comprising forming one or more signal routing channels in each anamux block, wherein:
a first set of the one or more signal routing channels is formed between a first major surface of the anamux block and an opposing second major surface of the anamux block;
each signal routing channel of the first set is configured to pass a signal from the first major surface to the opposing second major surface;
a second set of the one or more signal routing channels is formed between the first major surface of the anamux block and the core region; and
each signal routing channel of the second set is configured to pass a signal from the first major surface to the core region.

14. The method of claim 13, further comprising:
forming the first major surface of the anamux block on a top major surface of the corresponding I/O pad;
forming the second major surface of the anamux block as a top major surface of the anamux block; and
forming a functional block on the top major surface of the anamux block, wherein one or more of the signal routing channels electrically couples the corresponding I/O pad to circuitry comprised in the functional block.

15. The method of claim 14 wherein the functional block formed on the top major surface of the anamux block is one of a second anamux block and a decoupling capacitor.

16. The method of claim 13, further comprising:
forming the first major surface of the anamux block to abut a first neighboring functional block;
forming the second major surface of the anamux block to abut a second neighboring functional block; and
forming each of the first and second neighboring functional blocks on I/O pads neighboring the corresponding I/O pad.

17. The method of claim 16 wherein one of the first and second neighboring functional blocks is one of a second anamux block and a decoupling capacitor.

18. The method of claim 13, further comprising forming the anamux block and the corresponding I/O pad such that a height of the anamux block and the corresponding I/O pad permits two vertically-placed bonding windows in the I/O pad region.

19. The method of claim 13 further comprising:
forming the anamux block such that a width of the anamux block and a width of the corresponding I/O pad are the same.

* * * * *